United States Patent
Cheng et al.

(10) Patent No.: US 8,525,186 B2
(45) Date of Patent: Sep. 3, 2013

(54) METHOD OF FORMING A PLANAR FIELD EFFECT TRANSISTOR WITH EMBEDDED AND FACETED SOURCE/DRAIN STRESSORS ON A SILICON-ON-INSULATOR (SOI) WAFER, A PLANAR FIELD EFFECT TRANSISTOR STRUCTURE AND A DESIGN STRUCTURE FOR THE PLANAR FIELD EFFECT TRANSISTOR

(75) Inventors: Kangguo Cheng, Guilderland, NY (US); Johnathan E. Faltermeier, Delanson, NY (US); Toshiharu Furukawa, Essex Junction, VT (US); Xuefeng Hua, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 13/101,267

(22) Filed: May 5, 2011

(65) Prior Publication Data
US 2011/0204384 A1    Aug. 25, 2011

Related U.S. Application Data

(62) Division of application No. 12/470,001, filed on May 21, 2009, now Pat. No. 7,951,657.

(51) Int. Cl.
*H01L 21/00* (2006.01)
(52) U.S. Cl.
USPC ....... 257/77; 257/E29.068; 257/347; 716/100
(58) Field of Classification Search
USPC ............ 257/347–354, 77, E29.068; 716/100
See application file for complete search history.

(56) References Cited

U.S. PATENT DOCUMENTS

| | | |
|---|---|---|
| 6,395,587 B1 | 5/2002 | Crowder et al. |
| 6,506,654 B1 | 1/2003 | Wei et al. |
| 6,599,803 B2 | 7/2003 | Weon et al. |
| 6,861,318 B2 | 3/2005 | Murthy et al. |
| 6,885,084 B2 | 4/2005 | Murthy et al. |
| 6,891,192 B2 | 5/2005 | Chen et al. |
| 6,936,875 B2 | 8/2005 | Sugii et al. |

(Continued)

OTHER PUBLICATIONS

Mistry et al., "A 45nm Logic Technology with High-k+Metal Gate Transistors, Strained Silicon, 9Cu Interconnect Layers, 193nm Dry Patterning, and 100% Pb-Free Packaging", IEEE, 2007, pp. 247-250.
Cheng et al., U.S. Appl. No. 12/470,001, Office Action Communication, Oct. 8, 2010, 4 pages.
Cheng et al., U.S. Appl. No. 12/470,001, Notice of Allowance, Jan. 24, 2011, 9 pages.

*Primary Examiner* — Richard Booth
(74) *Attorney, Agent, or Firm* — Gibb & Riley, LLC; Anthony J. Canale

(57) ABSTRACT

Disclosed are embodiments of a method of forming, on an SOI wafer, a planar FET with embedded and faceted source/drain stressors. The method incorporates a directional ion implant process to create amorphous regions at the bottom surfaces of source/drain recesses in a single crystalline semiconductor layer of an SOI wafer. Then, an etch process selective to different crystalline planes over others and further selective to single crystalline semiconductor material over amorphous semiconductor material can be performed in order to selectively adjust the shape (i.e., the profile) of the recess sidewalls without increasing the depth of the recesses. Subsequently, an anneal process can be performed to re-crystallize the amorphous regions and an epitaxial deposition process can be used to fill the recesses with source/drain stressor material. Also disclosed are embodiments of a planar FET structure and a design structure for the planar FET.

20 Claims, 8 Drawing Sheets

(56) References Cited

U.S. PATENT DOCUMENTS

| | | |
|---|---|---|
| 6,946,350 B2 | 9/2005 | Lindert et al. |
| 7,009,200 B2 | 3/2006 | Tezuka et al. |
| 7,226,820 B2 | 6/2007 | Zhang et al. |
| 7,226,842 B2 | 6/2007 | Murthy et al. |
| 7,422,971 B2 | 9/2008 | Murthy et al. |
| 7,494,858 B2 | 2/2009 | Bohr et al. |
| 7,563,670 B2 | 7/2009 | Cheng et al. |
| 7,791,010 B2 * | 9/2010 | Abadeer .................. 250/208.1 |
| 2008/0119025 A1 | 5/2008 | Kwon et al. |

* cited by examiner

METHOD OF FORMING A PLANAR FIELD EFFECT TRANSISTOR WITH EMBEDDED AND FACETED SOURCE/DRAIN STRESSORS ON A SILICON-ON-INSULATOR (SOI) WAFER, A PLANAR FIELD EFFECT TRANSISTOR STRUCTURE AND A DESIGN STRUCTURE FOR THE PLANAR FIELD EFFECT TRANSISTOR

CROSS-REFERENCE TO RELATED APPLICATIONS

This application is a Divisional of U.S. Pat. No. 7,951,657, Issued May 31, 2011, the complete disclosure of which, in its entirety, is herein incorporated by reference.

BACKGROUND

1. Field of the Invention

The embodiments of the invention generally relate to planar field effect transistors (FETs) and, more particularly, to a method of forming a planar FET with embedded and faceted source/drain stressors on a silicon-on-insulator (SOI) wafer, a planar FET structure and a design structure for the planar FET.

2. Description of the Related Art

Charge carrier mobility impacts current flowing through the channel region of field effect transistors (FETs). That is, in n-type field effect transistors (NFETS) current flow is proportional to the mobility of electrons in the channel region, whereas in p-type field effect transistors (PFETs) current flow is proportional to the mobility of holes in that channel region. Stress can be imposed upon on the channel region in order to adjust carrier mobility and, thereby, adjust current flow. Specifically, compressive stress on the channel region of a PFET can enhance hole mobility and, thereby increase drive current. Contrarily, tensile stress on the channel region of an NFET can enhance electron mobility and, thereby increase drive current.

Various stress engineering techniques are known for imparting the desired stress on PFET and NFET channel regions including, but not limited to, the use of source/drain stressors. For example, as discussed in U.S. Pat. No. 6,885,084 of Murthy et al. issued on Apr. 26, 2005 and incorporated herein by reference, a compressive stress (i.e., a uni-axial compressive strain parallel to the direction of the current) can be created in the channel region of a planar PFET by forming the source/drain regions with an epitaxially grown alloy of, for example, Silicon and Germanium. Similarly, a tensile stress (i.e., a uni-axial tensile strain parallel to the direction of the current) can be created in the channel region of a planar NFET by forming the source/drain regions with an epitaxially grown alloy of, for example, Silicon and Carbon. Additionally, in both PFETs and NFETs the shape (i.e., the profile) of the interface between the source/drain stressors and the channel region can have an impact on the stress imparted on the channel region. For example, on bulk wafers, increased stress can be imparted on the channel region of a FET, if the source/drain stressor material is epitaxially grown in recesses having faceted sidewalls adjacent to the channel region. Unfortunately, this technique is incompatible with silicon-on-insulator (SOI) wafers and, more particularly, incompatible with current state of the art thin SOI (e.g., 45-110 nm SOI) wafers and ultra-thin SOI (e.g., sub-45 nm SOI) wafers.

SUMMARY

In view of the foregoing, disclosed herein are embodiments of a method of forming, on a silicon-on-insulator (SOI) wafer, a planar field effect transistor (FETs) with embedded and faceted source/drain stressors. The method embodiments can incorporate a directional ion implant process to create amorphous regions at the bottom surfaces of source/drain recesses in a single crystalline semiconductor layer of an SOI wafer. Then, an etch process selective to different crystalline planes over others and further selective to single crystalline semiconductor material over amorphous semiconductor material can be performed in order to selectively adjust the shape (i.e., the profile) of the recess sidewalls without increasing the depth of the recesses. Subsequently, an anneal process can be performed to re-crystallize the amorphous regions and an epitaxial deposition process can be used to fill the recesses with source/drain stressor material. Creation of the amorphous regions at the bottom surfaces of the recesses prior to etching the recess sidewalls ensures that enough semiconductor material will remain below the recesses to seed epitaxial deposition of the source/drain stressor material. Also disclosed are embodiments of a planar FET structure and a design structure for the planar FET.

Embodiments of the method of forming a planar FET, as disclosed herein, can comprise providing an SOI wafer comprising: a substrate, an insulator layer on the substrate and a single crystalline semiconductor layer on the insulator layer. A first etch process can be performed in order to form recesses in the single crystalline semiconductor layer on opposing sides of a designated channel region such that sidewalls of the recesses adjacent to the channel region have a first profile and such that bottom surfaces of the recesses are separated from the insulator layer by a predetermined distance (e.g., a distance of at least 10 nm). This first etch process can, for example, comprise an isotropic etch process that results in recess sidewalls with a curved profile. Alternatively, this first etch process can comprise an anisotropic etch process that results in a recess sidewalls that have a normal file (i.e., perpendicular profile).

After the first etch process is performed, a dopant can be implanted into the single crystalline semiconductor layer through the bottom surfaces of the recesses so to form, within the single crystalline semiconductor layer immediately adjacent to and aligned with the bottom surfaces, amorphous regions. This implant process can be performed so that the amorphous regions each have a thickness that is less than the distance separating the bottom surfaces of the recesses and the insulator layer and, thus, so that the amorphous regions do not contact the insulator layer. For example, if as mentioned above, the distance between the bottom surfaces of the recesses and the insulator layer is at least 10 nm, then the implant process can be performed such that the amorphous regions have a thickness that is less than approximately 10 nm.

Following the implant process, a second etch process can be performed that selectively etches different crystalline planes of the single crystalline semiconductor layer at the sidewalls of the recesses over others in order to change the first profile to a second profile (e.g., a faceted profile) that is different from the first profile. This second etch process can further be performed so that it selectively etches the sidewalls of the recess (i.e., the single crystalline semiconductor layer at the sidewalls of the recesses) over the bottom surfaces (i.e., over the amorphous regions at the bottom surfaces) in order to keep the distance separating the bottom surfaces of the recesses and the insulator layer essentially the same (e.g., at approximately 10 nm or more).

After the second etch process, an anneal process can be performed in order to re-crystallize the amorphous regions, leaving corresponding doped crystallized regions within the single crystalline semiconductor layer. Then, additional processing can be performed in order to complete the FET structure, including epitaxially growing, in the recesses, source/drain semiconductor material pre-selected to impart a desired stress on the channel region.

Also disclosed herein are embodiments of a planar FET formed according to the method embodiments described above. This FET can comprise a substrate and an insulator layer on the substrate. The FET can further comprise a single crystalline semiconductor layer on the insulator layer. The semiconductor layer can comprise a channel region, recesses with faceted sidewalls on opposing sides of the channel region and doped regions below the recesses. Specifically, the semiconductor layer can comprise recesses. The recess can be positioned at the top surface of the semiconductor layer and can have inner sidewalls positioned laterally adjacent to the channel region with each inner sidewall having a faceted profile. The recesses can further have bottom surfaces separated from the insulator layer by a predetermined distance (e.g., a distance of at least 10 nm). Additionally, the semiconductor layer can also comprise doped regions. The doped regions can be positioned immediately adjacent to and aligned with the bottom surfaces only of the recesses. Thus, the doped regions are positioned between the bottom surfaces of the recesses and the insulator layer, but not between the inner sidewalls of the recesses and the channel region. The thickness of the doped regions can be less approximately 10 nm and, more particularly, can be less than the distance separating the bottom surfaces of the recesses and the insulator layer such that the doped regions do not contact the insulator layer. The FET can further comprise embedded source/drain regions within the recesses. Specifically, the FET can comprise an epitaxially grown layer of semiconductor material that is within and fills the recesses. Depending upon the FET type, the semiconductor material can be doped with p-type or n-type source/drain dopants and further can comprise a material specifically pre-selected so as to impart either compressive stress or tensile stress on the channel region.

Also disclosed herein are embodiments of a design structure associated with the above-described planar FET. This design structure can be tangibly embodied in a machine readable medium for designing, manufacturing, and/or testing an integrated circuit and can comprise at least instructions that, when executed by a computer-aided design system, generate a machine-executable representation of the above-described planar FET.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

Figure 1:
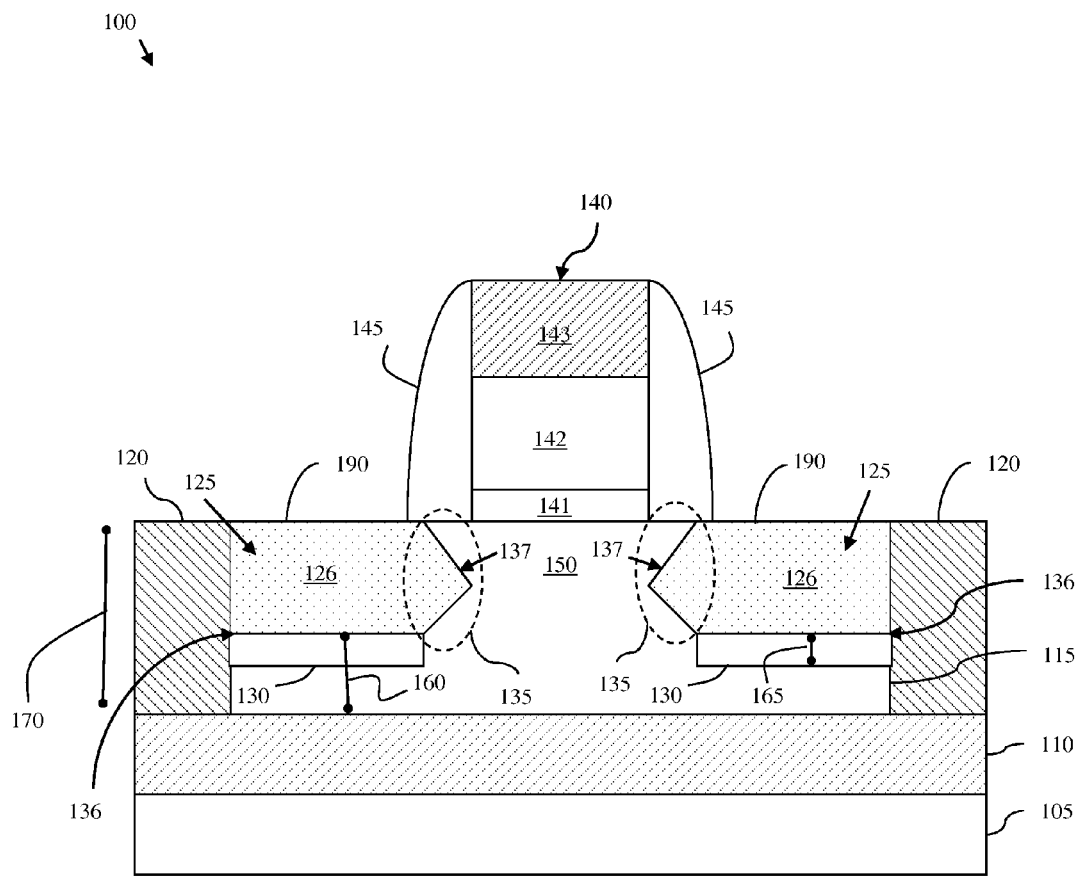
FIG. 1 is a schematic cross-section diagram illustrating an embodiment of a planar field effect transistor.

The embodiments of the invention and the various features and advantageous details thereof are explained more fully with reference to the non-limiting embodiments that are illustrated in the accompanying drawings and detailed in the following description.

As mentioned above, charge carrier mobility impacts current flowing through the channel region of field effect transistors (FETs). That is, in n-type field effect transistors (NFETS) current flow is proportional to the mobility of electrons in the channel region, whereas in p-type field effect transistors (PFETs) current flow is proportional to the mobility of holes in that channel region. Stress can be imposed upon on the channel region in order to adjust carrier mobility and, thereby, adjust current flow. Specifically, compressive stress on the channel region of a PFET can enhance hole mobility and, thereby increase drive current. Contrarily, tensile stress on the channel region of an NFET can enhance electron mobility and, thereby increase drive current.

Various stress engineering techniques are known for imparting the desired stress on PFET and NFET channel regions including, but not limited to, the use of source/drain stressors. For example, as discussed in U.S. Pat. No. 6,885,084 of Murthy et al. issued on Apr. 26, 2005 and incorporated herein by reference, a compressive stress (i.e., a uni-axial compressive strain parallel to the direction of the current) can be created in the channel region of a planar PFET by forming the source/drain regions with an epitaxially grown alloy of, for example, Silicon and Germanium. Similarly, a tensile stress (i.e., a uni-axial tensile strain parallel to the direction of the current) can be created in the channel region of a planar NFET by forming the source/drain regions with an epitaxially grown alloy of, for example, Silicon and Carbon.

Additionally, in both PFETs and NFETs the shape (i.e., the profile) of the interface between the source/drain stressors and the channel region can have an impact on the stress imparted on the channel region. For example, on bulk wafers, increased stress can be imparted on the channel region of a FET, if the source/drain stressor material is epitaxially grown in recesses having faceted sidewalls adjacent to the channel region. Unfortunately, this technique is incompatible with silicon-on-insulator (SOI) wafers and, more particularly, incompatible with current state of the art thin SOI (e.g., 45-110 nm SOI) wafers and ultra-thin SOI (e.g., sub-45 nm SOI) wafers.

Specifically, SOI wafers are typically formed to have horizontal surfaces (i.e., lateral surfaces) with a {100} crystalline orientation. In order to form recesses with faceted sidewalls on such SOI wafers, multiple etch processes are generally required. A first etch process creates the initial recesses (i.e., trenches, openings, etc.). Following this first etch process, the bottom surfaces of the recesses will have a {100} orientation and the sidewalls of the initial recesses will have a certain profile (e.g., curved or normal) depending upon the type of etch process used. A second different etch process is then used to change the profile of the sidewalls to a faceted profile. However, since the bottom surfaces and sidewalls of the recesses necessarily have different crystalline orientations and since different crystalline planes etch at different rates (e.g., {100} orientation surfaces etch at significantly faster rates than {110} orientation surfaces, which etch at faster rates than {111} orientation surfaces), the bottom surfaces of the recesses will continue to be etched away during the second etch process and at a faster rate than the sidewalls. Consequently, with thin and ultra-thin SOI wafers, by the time the second etch process is completed (i.e., by the time the faceted profile is created), the insulator layer is exposed at the bottom surfaces of the recesses. Unfortunately, without at least a thin seed layer at the bottom surfaces of the recesses (i.e., some remaining portion of the single crystalline semiconductor layer) the epitaxial growth process used to fill the recesses can not be accomplished.

In view of the foregoing, disclosed herein are embodiments of a method of forming, on a silicon-on-insulator (SOI) wafer, a planar field effect transistor (FETs) with embedded and faceted source/drain stressors. The method embodiments can incorporate a directional ion implant process to create amorphous regions at the bottom surfaces of source/drain recesses in a single crystalline semiconductor layer of an SOI wafer. Then, an etch process selective to different crystalline planes over others and further selective to single crystalline semiconductor material over amorphous semiconductor material can be performed in order to selectively adjust the shape (i.e., the profile) of the recess sidewalls without increasing the depth of the recesses. Subsequently, an anneal process can be performed to re-crystallize the amorphous regions and an epitaxial deposition process can be used to fill the recesses with source/drain stressor material. Creation of the amorphous regions at the bottom surfaces of the recesses prior to etching the recess sidewalls ensures that enough semiconductor material will remain below the recesses to seed epitaxial deposition of the source/drain stressor material. Also disclosed are embodiments of a planar FET structure and a design structure for the planar FET.

Figure 2:
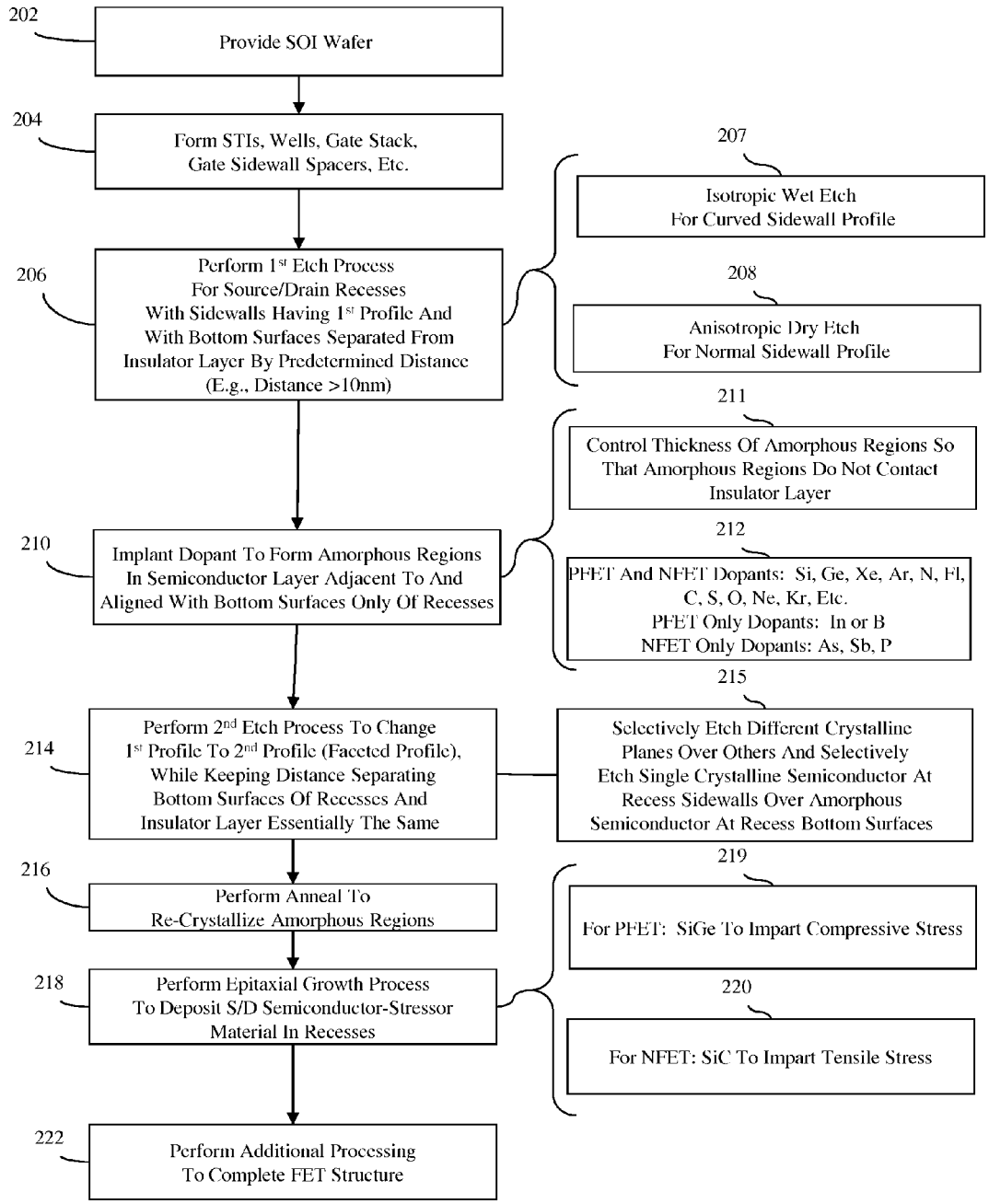
FIG. 2 is a flow diagram illustrating an embodiment of a method of forming the planar field effect transistor of FIG. 1.
Figure 3:
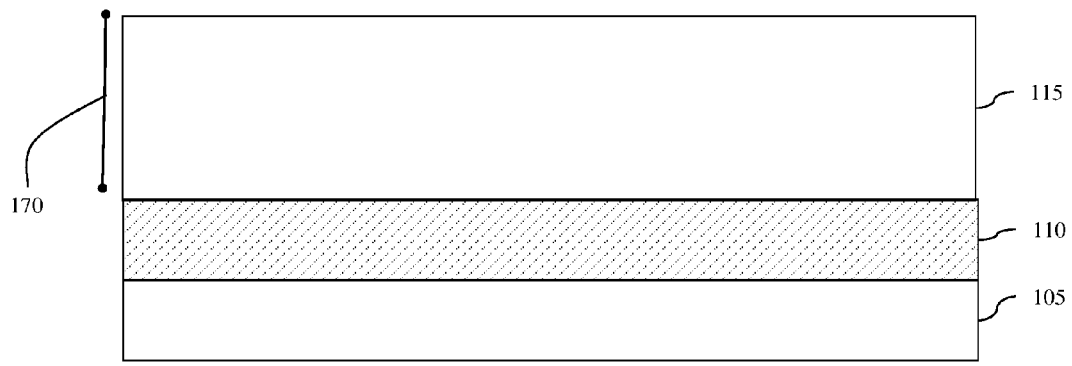
FIG. 3 is a schematic cross-section diagram illustrating a partially completed planar field effect transistor formed according to the method of FIG. 2.

More particularly, disclosed herein are embodiments of a method of forming a planar FET 100 with embedded and faceted source/drain stressors 190 (as shown in FIG. 1 and described in detail below). Referring to FIG. 2, the method embodiments comprise providing a silicon-on-insulator (SOI) wafer (202, see FIG. 3). This SOI wafer can comprise a substrate 105 (e.g., a p− silicon substrate). The SOI wafer can further comprise an insulator layer 110 (e.g., a buried oxide (BOX) layer or other suitable insulator layer) on the substrate 105. The SOI wafer can further comprise a single crystalline semiconductor layer 115 (e.g., a single crystalline silicon layer). The semiconductor layer 115 can be "thin" (i.e., can have a thickness 170 between 45-110 nm) or "ultra-thin" (i.e., can have a thickness 170 that is less than 45 nm).

Figure 4:
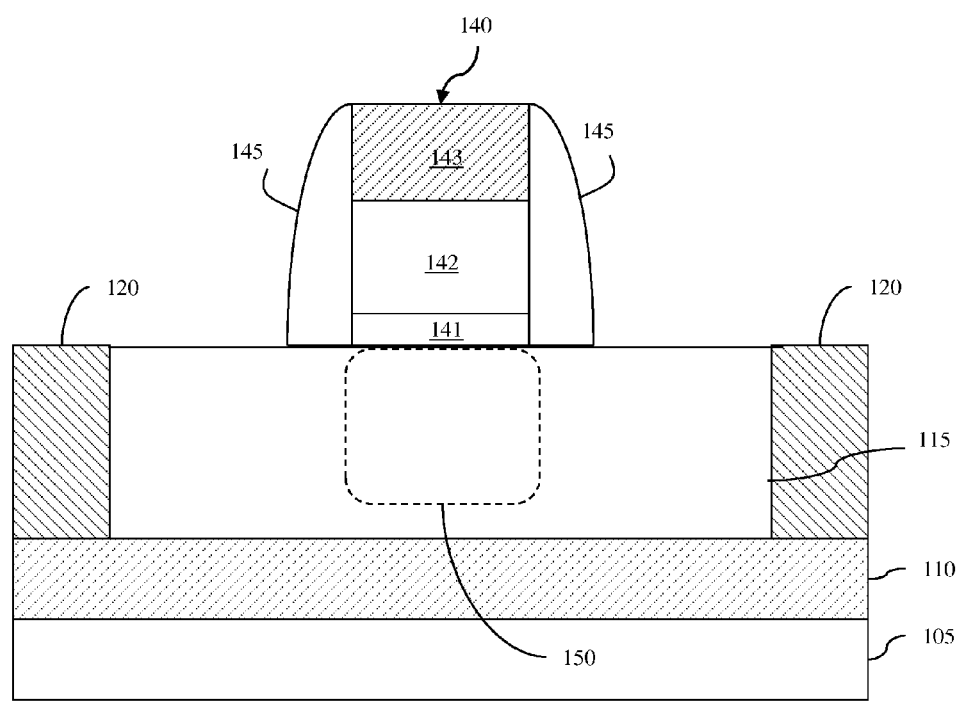
FIG. 4 is a schematic cross-section diagram illustrating a partially completed planar field effect transistor formed according to the method of FIG. 2.

Next, conventional processing can be performed in order to form shallow trench isolation (STI) regions 120 to define a device region within the semiconductor layer 115, to form wells (not shown), to form a gate stack 140 (e.g., a gate dielectric layer 141, a gate conductor layer 142 on the gate dielectric layer 141 and a cap layer 143, such as a nitride cap layer, on the gate conductor layer 142) over a designated channel region 150 within the device region, to form gate sidewall spacers 145 on opposing sides of the gate stack 140, etc. (204, see FIG. 4). Optionally, source/drain extension regions and/or halo regions can also be formed, depending upon the integration scheme (e.g., late or early). The details of the above-mentioned conventional processing are well-known and are omitted to allow the reader to focus on the salient aspects of the embodiments described herein.

Figure 5A:
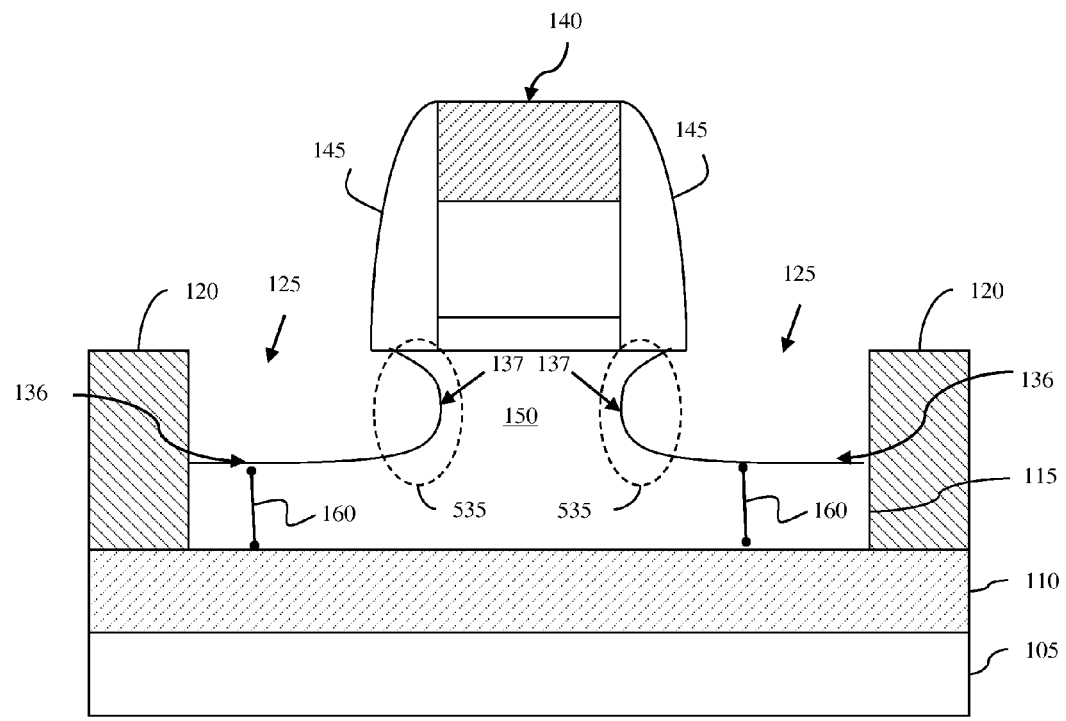
FIG. 5A is a schematic cross-section diagram illustrating a partially completed planar field effect transistor formed according to the method of FIG. 2.
Figure 5B:
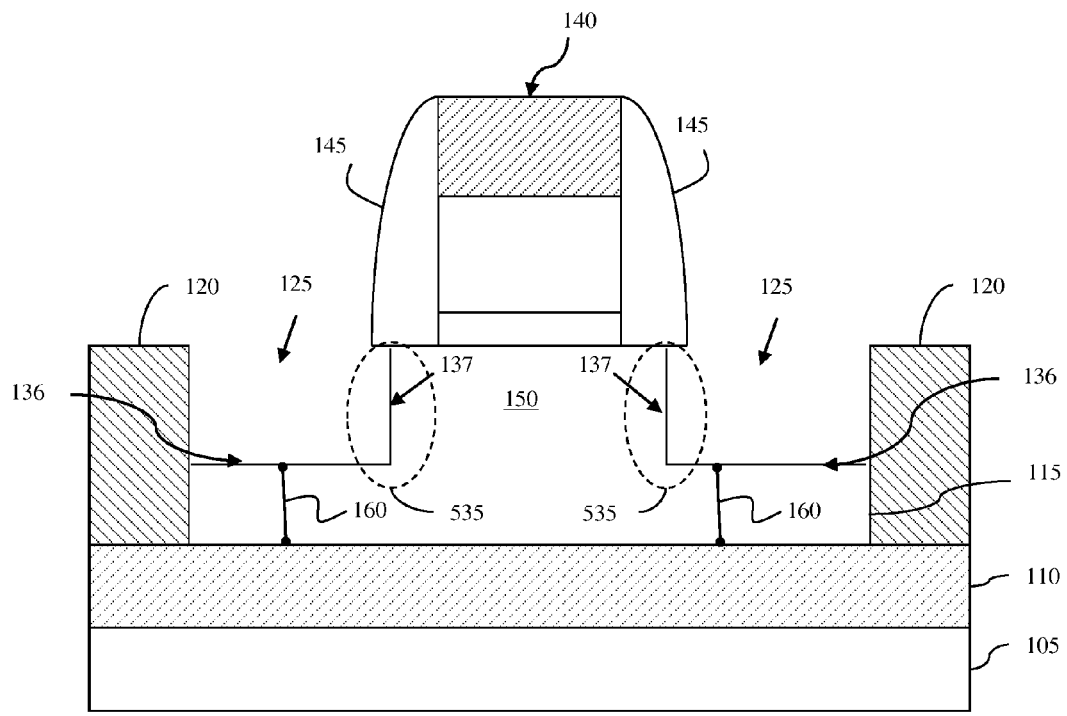
FIG. 5B is a schematic cross-section diagram illustrating a partially completed planar field effect transistor formed according to the method of FIG. 2.

Next, a first etch process can be performed in order to form, for the embedded source/drain regions, initial recesses 125 (i.e., trenches, opening, etc.) in the single crystalline semiconductor layer 115 on opposing sides of the designated channel region 150 (206, see FIGS. 5A and 5B). Specifically, this first etch process can be performed such that the inner sidewalls 137 of the recesses 125 adjacent to the channel region 150 have a first profile 535. For example, the first etch process can comprise an isotropic process (e.g., an isotropic wet etch process) such that the first profile 505 will comprise a curved profile (207, see FIG. 5A). Alternatively, the first etch process can comprise an anisotropic dry etch process (e.g., a reactive ion etch (RIE) process) such that the first profile 535 will be a normal profile relative to the wafer (i.e., perpendicular to the wafer) (208, see FIG. 5B). This first etch process can further be performed such that bottom surfaces 136 of the recesses 125 are separated from the insulator layer 110 by a predetermined distance 160 (e.g., a distance of at least 10 nm). That is, the first etch process can be performed such that it stops a predetermined distance above the insulator layer 110.

Figure 6:
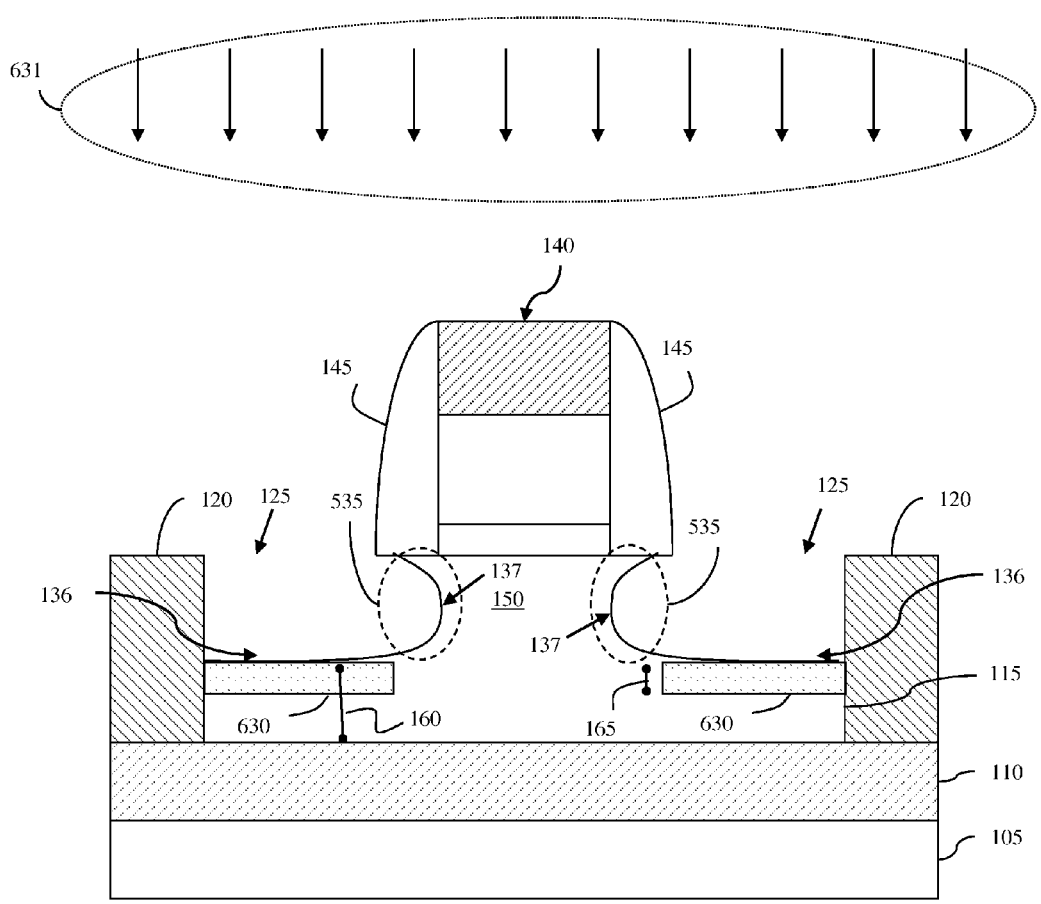
FIG. 6 is a schematic cross-section diagram illustrating a partially completed planar field effect transistor formed according to the method of FIG. 2.

After the first etch process is performed, a dopant 631 can be implanted into the single crystalline semiconductor layer 115 through the bottom surfaces 136 of the recesses 125 so to form, within the single crystalline semiconductor layer 115 immediately adjacent to and aligned with the bottom surfaces 136 of the recesses 125, amorphous regions 630 (210, see FIG. 6). This implant process can comprise a directional ion implantation process, which only implants the dopant 631 into exposed lateral surfaces of the single crystalline semiconductor layer 115. This directional ion implantation process can further be controlled to selectively limit the thickness 165 of the amorphous regions 630 so that it is less than the distance 160 separating the bottom surfaces 136 of the recesses 125 from the insulator layer 110 (i.e., so that the amorphous regions 630 do not contact the insulator layer 110) (211). That is, so that the depth of the implant does not reach the insulator layer. For example, a gas cluster ion beam implantation process can be used to limit the thickness of the doped regions to less than 10 nm. For both NFETs and PFETs, the dopant can be selected from a group of dopants including, but not limited to, Silicon, Germanium, Xenon, Argon, Nitrogen, Fluorine, Carbon, Sulfur, Oxygen, Neon, Krypton, etc. (212). Alternatively, the dopant can be FET-specific. For example, for PFETs, the dopant can also comprise Boron or Indium, whereas, for NFETS, the dopant can also comprise Arsenic, Phosphorous, or Antimony (212). It should be noted that, for illustration purposes, this process is shown in FIG. 6 as being performed on the structure of FIG. 5A. However, it would be equally applicable to the structure of FIG. 5B.

Figure 7:
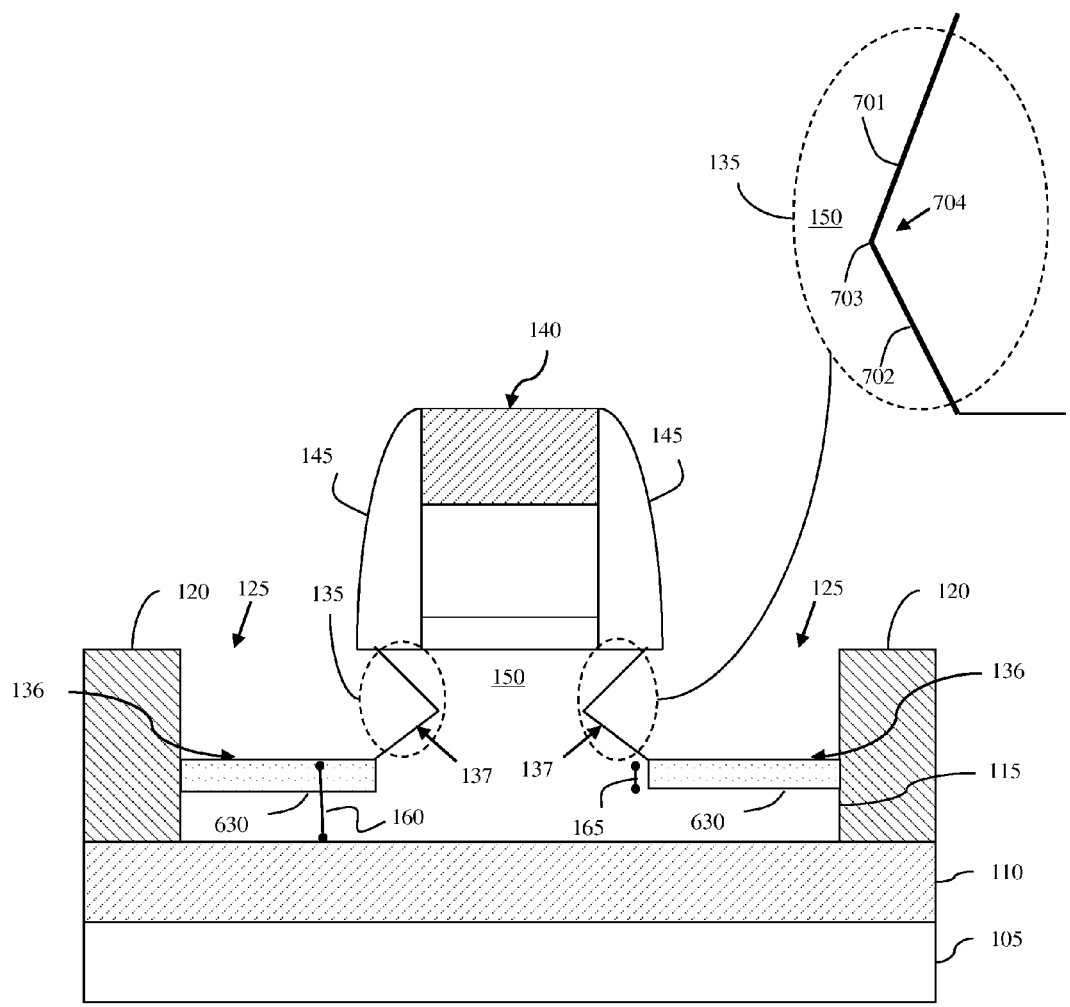
FIG. 7 is a schematic cross-section diagram illustrating a partially completed planar field effect transistor formed according to the method of FIG. 2.

After the amorphous regions 630 are formed, a second etch process can be performed that selectively etches different crystalline planes of the single crystalline semiconductor layer at the sidewalls 137 of the recesses 125 over others (i.e., is orientation dependent) in order to change the first profile 535 (as shown in FIGS. 5A or 5B) to a second profile 135 that is different from the first profile (e.g., to change a curved or normal profile to a faceted profile) (214-215, see FIG. 7). As shown in the exploded view of the profile 135 in FIG. 7, the term faceted profile as used herein refers to a profile having a first planar surface 701, which extends downward at an angle from the top surface of the semiconductor layer 115, and a second planar surface 702, which extends upward at an angle from the bottom surface of the recess, converging into a point 703 so as to create an angular shape 704 projecting towards the channel region 150. For example, in a semiconductor layer having a horizontal surface orientation of {100}, an anisotropic wet etch process can be used to create faceted recess sidewalls with {111} orientation planes 710, 702 (i.e., facets) converging into a point 703 to create an angular shape 704 (e.g., a 109.4 degree angular shape) projecting toward the channel region 150. This second etch process can further be performed so that it selectively etches the sidewalls 137 of the recesses 125 (i.e., the single crystalline semiconductor layer at the sidewalls of the recesses) over the bottom surfaces 136 (i.e., over the amorphous regions 630 at the bottom surfaces 136) in order to keep the distance 160 separating the bottom surfaces 136 of the recesses 125 and the insulator layer 110 essentially the same (e.g., approximately 10 nm or more) (214-215, see FIG. 7).

An exemplary technique that can be used at processes 212-213 both to selectively etch different crystalline planes of semiconductor material over others and to selectively etch single crystalline semiconductor material over amorphous semiconductor material is disclosed in U.S. Pat. No. 7,563,670, of Cheng et al., issued on Jul. 21, 2009 and incorporated herein by reference. This technique provides for selectively etching single crystalline semiconductor material, while only minimally etching amorphous semiconductor material, by placing a wafer in an ambient light, ambient open-top tank of an ammonium hydroxide ($NH_4OH$) solution such that single crystalline and amorphous surfaces are simultaneously exposed to the solution. Etch temperatures and solution concentrations can be selectively varied in order to achieve a desired etch selectivity ratio, for example, a ratio of up to or greater than a 50:1 between the amount of single crystalline material being removed and amorphous material being removed. Such a high etch selectivity ratio allows the first profile to be changed while only minimally reducing the distance by which the bottom surfaces of the recesses are separated from the insulator layer.

Figure 8:
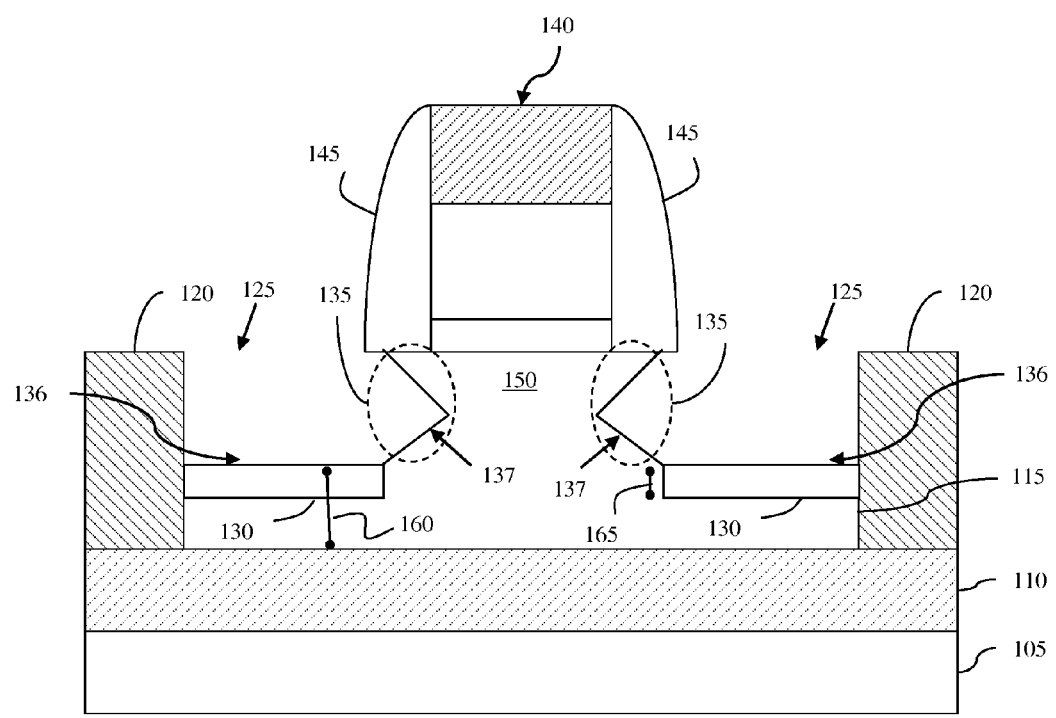
FIG. 8 is a schematic cross-section diagram illustrating a partially completed planar field effect transistor formed according to the method of FIG. 2.

After the performing of the second etch process, an anneal process can be performed to re-crystallize the amorphous regions 630, leaving corresponding doped crystallized regions 130 within the single crystalline semiconductor layer 115 (216, see FIG. 8). The anneal process can be performed at a temperature ranging from approximately 400-1200° C. This temperature may vary depending upon anneal duration, the dopant and/or dopant concentration within the amorphous region and, thus, the temperature is more specifically a pre-selected temperature sufficient to bring about the required re-crystallization. The anneal process can be performed using any known anneal process techniques (e.g., furnace anneal, rapid thermal anneal, laser anneal, etc.).

After the anneal process, an epitaxial growth process is performed in order to fill the recesses 125 with a FET-specific source/drain semiconductor-stressor material 126 and create embedded and faceted source/drain regions 190 (218, see FIG. 1). For example, for a PFET, the Silicon Germanium 126 can be epitaxially deposited into the recesses 125 to form embedded source/drain regions 190 which function as stressors that impart compressive stress (i.e., a uni-axial compressive strain parallel to the direction of the current) on the PFET channel region 150 (219). Similarly, for an NFET, Silicon Carbide 126 can be epitaxially deposited into the recesses 125 to form embedded source/drain regions 190 which function as stressors that impart tensile stress (i.e., a uni-axial tensile strain parallel to the direction of the current) on the NFET channel region 150 (220). Creation of the amorphous regions 630 at the bottom surfaces 136 of the recesses 125 (as shown in FIG. 6) prior to etching the recess sidewalls 137 ensures that enough semiconductor material from the layer 115 will remain below the recesses 125 (as shown in FIG. 7) to seed this epitaxial deposition process.

It should be noted that during the epitaxial deposition process the source/drain regions being formed can be in situ doped with suitable source/drain dopants. For example, the source/drain regions for a PFET can be in situ doped with a Group III dopant, such as Boron or Indium, whereas source/drain regions for an NFET can be implanted with a Group V dopant, such as Arsenic, Phosphorous or Antimony. Alternatively, such source/drain dopants can be implanted following epitaxial deposition.

After the embedded and faceted source/drain stressor regions 190 are formed, as shown in FIG. 1, additional processing can be performed in order to complete the planar FET structure 100 (222). This additional processing can include, but is not limited to, silicide formation, interlayer dielectric deposition, contact formation, etc.

Referring to FIG. 1, also disclosed are embodiments of a planar FET 100 formed according to the method embodiments described above. This planar FET 100 can comprise a substrate 105 (e.g., a silicon substrate), an insulator layer 110 (e.g., a buried oxide (BOX) layer or other suitable insulator layer) on the substrate 105 and a semiconductor layer 115 on the insulator layer 110. Shallow trench isolation (STI) regions 120 can extend through the semiconductor layer 115 down to the insulator layer 110 and can define a device region within the semiconductor layer 115. A gate stack 140 (e.g., a gate dielectric layer 141, a gate conductor layer 142 on the gate dielectric layer 141 and a cap layer 143, such as a nitride cap layer, on the gate conductor layer 142) can be positioned above a designated channel region 150 within the device region of the semiconductor layer 115. Additionally, gate sidewall spacers 145 can be positioned on opposing sides of the gate stack 140.

More specifically, the semiconductor layer can comprise a "thin" (e.g., 45-110 nm) or "ultra-thin" (e.g., sub-45 nm) single crystalline semiconductor layer 115 (e.g., a single crystalline silicon layer) on the insulator layer 110. The semiconductor layer 115 can further comprise recesses 125 (i.e., trenches, openings, etc.) on opposing sides of the designated channel region 150. These recesses 125 can have inner sidewalls 137 positioned laterally adjacent to the channel region 150 with each inner sidewall 137 having a faceted profile 135. As shown in the exploded view of the profile 135 in FIG. 7, the term faceted profile as used herein refers to a profile having a first planar surface 701, which extends downward at an angle from the top surface of the semiconductor layer 115, and a second planar surface 702, which extends upward at an angle from the bottom surface of the recess, converging into a point 703 so as to create an angular shape 704 projecting towards the channel region 150. For example, in a semiconductor layer having a horizontal surface orientation of {100}, an anisotropic wet etch process can be used to create faceted recess sidewalls with {111} orientation planes 710, 702 (i.e., facets) converging into a point 703 to create an angular shape 704 (e.g., a 109.4 degree angular shape) projecting toward the channel region 150. The recesses 125 can further have bottom surfaces 136 separated from the insulator layer 110 by a predetermined distance 160 (e.g., a distance of at least 10 nm).

Additionally, the semiconductor layer 115 can comprise doped regions 130 immediately adjacent to and aligned with the bottom surfaces 136 only of the recesses 125 such that the doped regions 130 are positioned between the bottom surfaces 136 of the recesses 125 and the insulator layer 110, but not between the inner sidewalls 137 of the recesses 125 and the channel region 150. As discussed in detail above, the doped regions 130 can comprise a dopant implanted during processing to create amorphized regions. Creation of the amorphous regions at the bottom surfaces of the recesses prior to etching the recess sidewalls to achieve the faceted profile, followed by subsequent recrystallization ensures that enough semiconductor material remains below the recesses to seed epitaxial source/drain material deposition. For both NFETs and PFETs, the dopant can comprise any of Silicon, Germanium, Xenon, Argon, Nitrogen, Fluorine, Carbon, Sulfur, Oxygen, Neon, Krypton, etc. Alternatively, the dopant can be FET-specific. For example, for PFETs, the dopant can also comprise Boron or Indium, whereas, for NFETS, the dopant can also comprise Arsenic, Phosphorous, or Antimony. The thickness 165 of the doped regions 130 can be less than approximately 10 nm and, more particularly, can be less than the distance 160 separating the bottom surfaces 136 of the recesses 125 and the insulator layer 11. Thus, the doped regions 130 do not contact the insulator layer 110.

The FET 100 can further comprise embedded source/drain stressor regions 190 within the recesses 125. Specifically, the FET 100 can comprise an epitaxially grown layer of semiconductor material 126 that is within and fills the recesses 125. Depending upon the FET type, the semiconductor material 126 can be doped with p-type or n-type source/drain dopants and further can comprise a material specifically preselected so as to impart either compressive stress or tensile stress on the channel region. For example, the source/drain regions 190 for a PFET can be doped with a Group III dopant, such as Boron or Indium, whereas source/drain regions 190 for an NFET can be implanted with a Group V dopant, such as Arsenic, Phosphorous or Antimony. Additionally, for a PFET, the semiconductor material 126 within the recesses 125 can comprise Silicon Germanium which functions as a stressor that imparts compressive stress (i.e., a uni-axial compressive strain parallel to the direction of the current) on the PFET channel region 150. Similarly, for an NFET, the semiconductor material 126 within the recesses 125 can comprise Silicon Carbide which functions as stressor that imparts tensile stress (i.e., a uni-axial tensile strain parallel to the direction of the current) on the NFET channel region 150.

Also disclosed herein are embodiments of a design structure associated with the above-described planar FET. This design structure can be tangibly embodied in a machine readable medium for designing, manufacturing, and/or testing an integrated circuit and can comprise at least instructions that, when executed by a computer-aided design system, generate a machine-executable representation of the above-described planar FET. This design structure can comprise a netlist. Additionally, it can reside on a storage medium as a data format used for the exchange of layout data of integrated circuits or it can reside in a programmable gate array.

Figure 9:
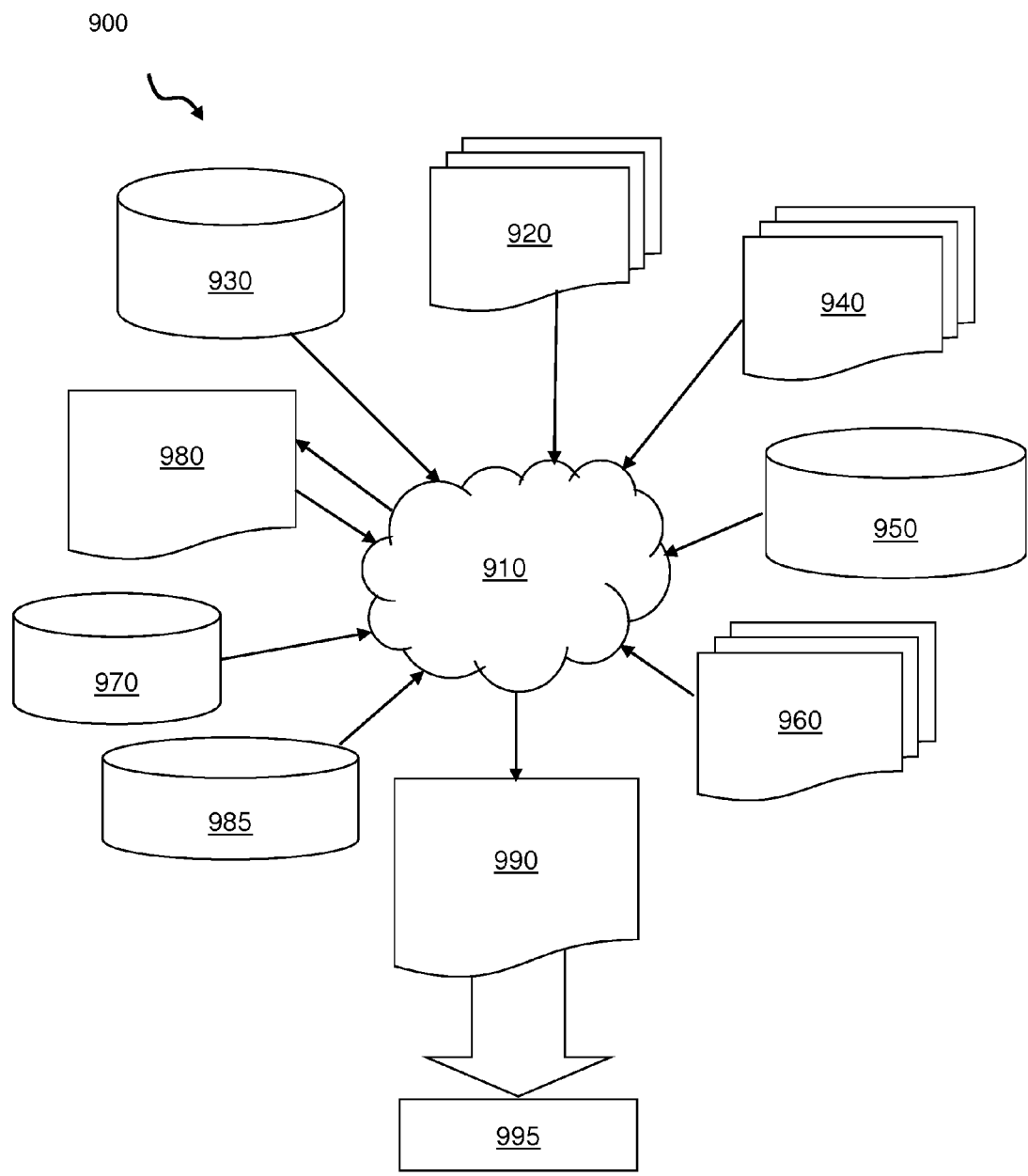
FIG. 9 is a flow diagram of a design process used in semiconductor design, manufacture, and/or test.

Specifically, FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1. As such, design structure 920 may comprise files or other data structures including human and/or machine-readable source code, compiled structures, and computer-executable code structures that, when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 990 may comprise a compiled, executable HDL simulation model that functionally simulates the device shown in FIG. 1.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of a method of forming, on a silicon-on-insulator (SOI) wafer, a planar field effect transistor (FETs) with embedded and faceted source/drain stressors. The method embodiments can incorporate a directional ion implant process to create amorphous regions at the bottom surfaces of source/drain recesses in a single crystalline semiconductor layer of an SOI wafer. Then, an etch process selective to different crystalline planes over others and further selective to single crystalline semiconductor material over amorphous semiconductor material can be performed in order to selectively adjust the shape (i.e., the profile) of the recess sidewalls without increasing the depth of the recesses. Subsequently, an anneal process can be performed to re-crystallize the amorphous regions and an epitaxial deposition process can be used to fill the recesses with source/drain stressor material. Creation of the amorphous regions at the bottom surfaces of the recesses prior to etching the recess sidewalls ensures that enough semiconductor material will remain below the recesses to seed epitaxial deposition of the source/drain stressor material. Also disclosed are embodiments of a planar FET structure and a design structure for the planar FET.

What is claimed is:

1. A field effect transistor comprising:
a substrate;
an insulator layer on said substrate;
a semiconductor layer on said insulator layer, said semiconductor layer comprising:
a channel region; and
recesses on opposing sides of said channel region, said recesses having inner sidewalls positioned laterally adjacent to said channel region with each inner sidewall having a faceted profile, said recesses further having bottom surfaces separated from said insulator layer by a distance and said semiconductor layer have doped regions between said bottom surfaces and said insulator layer; and a semiconductor material within said recesses, said semiconductor material being pre-selected so as to impart one of tensile stress and compressive stress on said channel region.

2. The field effect transistor of claim 1, said doped regions being immediately adjacent to and aligned with said bottom surfaces only of said recesses such that said doped regions are positioned between said bottom surfaces of said recesses and said insulator layer and are further not positioned between said inner sidewalls of said recesses and said channel region, and said doped regions having a thickness that is less than said distance such that said doped regions do not contact said insulator layer.

3. The field effect transistor of claim 1, said distance comprising at least 10 nm.

4. The field effect transistor of claim 2, said thickness comprising less than 10nm.

5. The field effect transistor of claim 2, said field effect transistor comprising a p-type field effect transistor, said semiconductor material comprising Silicon Germanium and said doped regions comprising a dopant comprising any of Silicon, Germanium, Xenon, Argon, Nitrogen, Fluorine, Carbon, Sulfur, Oxygen, Neon, Krypton, Indium and Boron.

6. The field effect transistor of claim 2, said field effect transistor comprising an n-type field effect transistor, said semiconductor material comprising Silicon Carbide and said doped regions comprising a dopant comprising any of Silicon, Germanium, Xenon, Argon, Nitrogen, Fluorine, Carbon, Sulfur, Oxygen, Neon, Krypton, Arsenic, Phosphorous and Antimony.

7. The field effect transistor of claim 1, said semiconductor layer having a thickness of less than 45nm.

8. A design structure tangibly embodied in a machine readable medium for designing, manufacturing, and/or testing an integrated circuit, said design structure comprising at least instructions that, when executed by a computer-aided design system, generate a machine-executable representation of a field effect transistor, said field effect transistor comprising a substrate;

an insulator layer on said substrate;

a semiconductor layer on said insulator layer, said semiconductor layer comprising:

a channel region;

recesses on opposing sides of said channel region, said recesses having inner sidewalls positioned laterally adjacent to said channel region with each inner sidewall having a faceted profile, said recesses further having bottom surfaces separated from said insulator layer by a distance and said semiconductor layer have doped regions between said bottom surfaces and said insulator layer; and a semiconductor material within said recesses, said semiconductor material being pre-selected so as to impart one of tensile stress and compressive stress on said channel region.

9. The design structure of claim 8, said design structure comprising a netlist.

10. The design structure of claim 8, said design structure residing on said machine readable medium as a data format used for exchange of layout data of integrated circuits.

11. The design structure of claim 8, said design structure residing in a programmable gate array.

12. The design structure of claim 8, said doped regions being immediately adjacent to and aligned with said bottom surfaces only of said recesses such that said doped regions are positioned between said bottom surfaces of said recesses and said insulator layer and are further not positioned between said inner sidewalls of said recesses and said channel region, and said doped regions having a thickness that is less than said distance such that said doped regions do not contact said insulator layer.

13. The design structure of claim 8, said distance comprising at least 10 nm.

14. The design structure of claim 12, said thickness comprising less than 10nm.

15. The design structure of claim 8, said field effect transistor comprising a p-type field effect transistor, said semiconductor material comprising Silicon Germanium and said doped regions comprising a dopant comprising any of Silicon, Germanium, Xenon, Argon, Nitrogen, Fluorine, Carbon, Sulfur, Oxygen, Neon, Krypton, Indium and Boron.

16. The design structure of claim 8, said field effect transistor comprising an n-type field effect transistor, said semiconductor material comprising Silicon Carbide and said doped regions comprising a dopant comprising any of Silicon, Germanium, Xenon, Argon, Nitrogen, Fluorine, Carbon, Sulfur, Oxygen, Neon, Krypton, Arsenic, Phosphorous and Antimony.

17. The design structure of claim 8, said semiconductor layer having a thickness of less than 45nm.

18. A field effect transistor comprising:

a substrate;

an insulator layer on said substrate;

a semiconductor layer on said insulator layer, said semiconductor layer comprising:

a channel region; and recesses on opposing sides of said channel region, said recesses having inner sidewalls positioned laterally adjacent to said channel region with each inner sidewall having a faceted profile;

a semiconductor material within said recesses, said semiconductor material being pre-selected so as to impart one of tensile stress and compressive stress on said channel region, said recesses further having bottom surfaces separated from said insulator layer by a distance; and said semiconductor layer further comprising doped regions immediately adjacent to and aligned with said bottom surfaces only of said recesses such that said doped regions are positioned between said bottom surfaces of said recesses and said insulator layer and are further not positioned between said inner sidewalls of said recesses and said channel region, wherein a thickness of said doped regions is less than said distance such that said doped regions do not contact said insulator layer.

19. The field effect transistor of claim 18, said distance comprising at least 10nm.

20. The field effect transistor of claim 18, said thickness comprising less than 10nm.

* * * * *